US012630763B2

(12) United States Patent
Nie et al.

(10) Patent No.: US 12,630,763 B2
(45) Date of Patent: May 19, 2026

(54) COMPOSITE MATERIAL AND PREPARATION METHOD THEREOF AND QUANTUM DOT LIGHT-EMITTING DIODE

(71) Applicant: TCL TECHNOLOGY GROUP CORPORATION, Huizhou (CN)

(72) Inventors: Zhiwen Nie, Huizhou (CN); Xuanyu Zhang, Huizhou (CN); Wenyong Liu, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 988 days.

(21) Appl. No.: 17/840,063

(22) Filed: Jun. 14, 2022

(65) Prior Publication Data

US 2022/0328786 A1 Oct. 13, 2022

Related U.S. Application Data

(63) Continuation of application No. PCT/CN2020/139318, filed on Dec. 25, 2020.

(30) Foreign Application Priority Data

Jun. 15, 2020 (CN) ........................ 202010546645.0

(51) Int. Cl.
*C09K 11/88* (2006.01)
*H10K 50/16* (2023.01)
(Continued)

(52) U.S. Cl.
CPC ............ *C09K 11/883* (2013.01); *H10K 50/16* (2023.02); *H10K 50/115* (2023.02); *H10K 71/40* (2023.02);
(Continued)

(58) Field of Classification Search
None
See application file for complete search history.

(56) References Cited

U.S. PATENT DOCUMENTS

2011/0121260 A1 5/2011 Jang et al.
2020/0263083 A1* 8/2020 Kim ...................... C09K 11/70

FOREIGN PATENT DOCUMENTS

CN 105990524 A 10/2016
CN 105153807 A * 12/2016
(Continued)

OTHER PUBLICATIONS

International Search Report mailed Mar. 24, 2021, in corresponding to International Application No. PCT/CN2020/139318; 6 pages.

*Primary Examiner* — Tae H Yoon
(74) *Attorney, Agent, or Firm* — Maier & Maier, PLLC

(57) ABSTRACT

A composite material, a preparation method thereof, and a quantum dot light-emitting diode. The composite material includes n-type metal oxide nanoparticles and an organic molecule shown in Formula I connected to the n-type metal oxide nanoparticles, and the organic molecule is bound on the surface of the n-type metal oxide nanoparticles through carboxyl groups. In Formula I, R is a hydrocarbyl group or a hydrocarbyl derivative containing at least one conjugation effect unit. The composite material has good film-forming quality and crystalline properties, and enhances the electron mobility of the composite material through conjugation efficiency, thereby having good electron transportation capability.

13 Claims, 1 Drawing Sheet

(51) Int. Cl.
*H10K 50/115* (2023.01)
*H10K 71/40* (2023.01)
*H10K 85/10* (2023.01)

(52) U.S. Cl.
CPC ........ *H10K 85/111* (2023.02); *H10K 85/1135* (2023.02)

(56) References Cited

FOREIGN PATENT DOCUMENTS

| | | | | |
|---|---|---|---|---|
| CN | 108276986 | A | * | 7/2018 |
| CN | 109301074 | A | | 2/2019 |
| CN | 109851571 | A | | 6/2019 |
| CN | 109935713 | A | | 6/2019 |
| CN | 109935724 | A | * | 6/2019 |
| CN | 109980109 | A | | 7/2019 |
| CN | 111129320 | A | | 5/2020 |
| JP | 2004233755 | A | * | 8/2004 |
| WO | 2012137211 | A1 | | 10/2012 |

* cited by examiner

COMPOSITE MATERIAL AND PREPARATION METHOD THEREOF AND QUANTUM DOT LIGHT-EMITTING DIODE

CROSS-REFERENCE TO RELATED APPLICATIONS

This application is a continuation application of International Patent Application No. PCT/CN2020/139318 with an international filing date of Dec. 25, 2020, designating the United States, now pending, and further claims priority benefits to Chinese Patent Application No. 202010546645.0 filed on Jun. 15, 2020. The contents of all of the aforementioned applications, including any intervening amendments thereto, are incorporated herein by reference.

TECHNICAL FIELD

The present application relates to the technical field of light-emitting device materials, in particular, to a composite material, a preparation method thereof, and a quantum dot light-emitting diode.

BACKGROUND

The electroluminescent devices of quantum dots still have defects such as low efficiency and short life, and the construction of high-efficiency QLED devices is usually prepared by solution method, usually using inorganic metal oxides such as zinc oxide as the electron transportation layer (ETL) of QLEDs. In order to maintain the excellent optical stability of quantum dots, the surface ligands of quantum dots are generally non-polar, which leads to poor contact with inorganic metal oxides and makes electron injection more difficult. In addition, the electron mobility of the existing QLED devices is generally much higher than the hole mobility, which makes the charge accumulation phenomenon at the QD/ETL interface very serious, and has a very adverse effect on the efficiency and life of the QLED device. Moreover, the film structure of metal oxide nanoparticles after spin coating is often a disordered loose structure, containing a large number of various defects, such as micropores. At the same time, accumulation is easy to occur in some specific directions, and the uniformity is poor.

SUMMARY

In order to solve the above-mentioned technical problems, the technical solutions adopted in the examples of the present application are:

On the first aspect, the present application provides a composite material, which includes n-type metal oxide nanoparticles and an organic molecule as shown in the following formula I connected to the n-type metal oxide nanoparticles.

Formula I

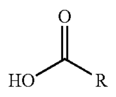

R is a hydrocarbyl group or a hydrocarbyl derivative containing at least one conjugation effect unit.

On the second aspect, the present application provides a method for preparing the composite material, which includes the followings steps:

n-type metal oxide nanoparticles and an organic molecule shown in formula I below are provided.

The n-type metal oxide nanoparticles and the organic molecule are dissolved in a polar solvent to obtain a mixed solution.

Solid materials are separated from the mixed solution to obtain the composite material.

Formula I

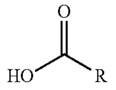

R is a hydrocarbyl group or a hydrocarbyl derivative containing at least one conjugation effect unit.

On the third aspect, the present application provides a quantum dot light-emitting diode, which includes an anode, a cathode and a quantum dot light-emitting layer between the anode and the cathode. An electron transportation layer is arranged between the cathode and the quantum dot light-emitting layer, the electron transportation layer is made of the composite material provided by the present application.

Beneficial Effect

The beneficial effect of the composite material provided in the examples of the present application is that: the composite material includes n-type metal oxide nanoparticles and an organic molecule represented by formula I connected to the n-type metal oxide nanoparticles, and the carboxyl groups in the organic molecule are combined with the metal ions on the surface of n-type metal oxide nanoparticles; the composite material is incorporated by the organic molecule containing the monocarboxylic acid structure of the conjugation effect unit, so that after the small molecule of the monocarboxylic acid structure of the conjugation effect unit is connected to the n-type metal the oxide nanoparticles, the conjugation effect unit of the conjugation effect unit makes the electron transfer between the n-type metal oxide nanoparticles easier, and the conjugation effect assists the conduction of electrons between the nanoparticles, which improves the electron transfer of the n-type metal oxide nanoparticles. At the same time, due to the large steric hindrance of the organic molecule structure in the spatial dimension, the local aggregation of n-type metal oxide nanoparticles can be effectively prevented, thereby improving the uniformity of the film formation of n-type metal oxide nanoparticles, and effectively preventing the local concentration of the current. Therefore, the composite material has good film-forming quality and crystalline properties, enhances the electron mobility of the composite material through conjugation efficiency, and thus has good electron transportation ability.

The beneficial effect of the method for preparing the composite material provided in the example of the present application is that: by dissolving n-type metal oxide nanoparticles and the organic molecule represented by formula I in a polar solvent for heat treatment, followed by solid-liquid separation, the composite material is obtained in the preparation method. The preparation method is not only simple in process, low in cost, and capable of large-scale preparation, but also the composite material obtained by the preparation method is incorporated with organic molecules having a monocarboxylic acid structure with a conjugation effect unit, thereby improving the film-forming quality and crystalline properties of the composite material, enhancing the electron mobility of the composite material through conjugation efficiency, and having a good electron transportation ability.

The beneficial effect of the quantum dot light-emitting diode provided by the example of the present application is that: the electron transportation layer in the quantum dot light-emitting diode is made of the unique composite material of the present application, and the composite material can improve the film quality and the quality of the electron transportation layer. The crystalline properties can enhance the electronic conductivity of composite materials through the conjugation effect, improve the effective utilization of electrons, reduce defect recombination, and enhance electron injection, thereby reducing the charge accumulation at the interface of the quantum dot light-emitting layer and the electron transportation layer, and finally improving the efficiency and lifetime of QLED devices.

BRIEF DESCRIPTION OF THE DRAWINGS

In order to illustrate the technical solutions in the examples of the present application more clearly, the following briefly introduces the accompanying drawings that are used in the description of the examples or exemplary technologies. Obviously, the drawings in the following description are only for the present application. In some examples, for those of ordinary skill in the art, other drawings can also be obtained according to these drawings without any creative effort.

DETAILED DESCRIPTION OF THE EMBODIMENTS

Figure 1:
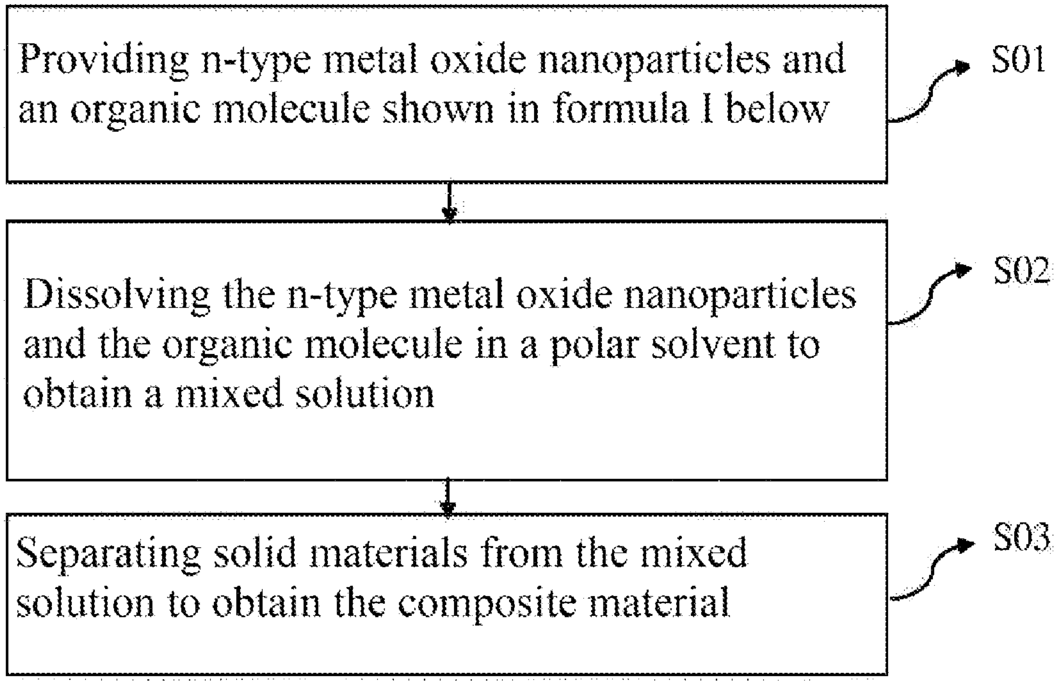
FIG. 1 is a flow chart of the method for preparing the composite material of the example of the present application.

In order to make the purpose, technical solutions and beneficial effects of the present application more clearly understood, the present application will be described in further detail below with reference to the accompanying drawings and embodiments. It should be understood that the specific embodiments described herein are only used to explain the present application, but not to limit the present application.

Some embodiments of the present application provide a composite material including n-type metal oxide nanoparticles and an organic molecule shown in the following formula I connected to the n-type metal oxide nanoparticles, the organic molecule is bound by carboxyl groups on the surface of the n-type metal oxide nanoparticles;

Formula I

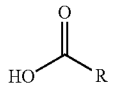

R is a hydrocarbyl group or a hydrocarbyl derivative containing at least one conjugation effect unit.

Specifically, in the above organic molecule, R is a hydrocarbyl group or a hydrocarbyl derivative containing at least one conjugation effect unit, which may be an alkene or an alkene derivative containing at least one conjugation effect unit, or an aromatic hydrocarbon or an aromatic hydrocarbon derivative containing at least one conjugation effect unit.

In some embodiments, the conjugation effect unit includes at least one selected from the group consisting of benzene ring, —CH═CH—CH═$CH_2$ and —CH═CH—CH═CH—, —CH═CH—CH═O, —CH═CH—CO— and $CH_2$═CH—CO—. In the organic molecule, R may contain only one of the above conjugation effect units, or a combination of two or more conjugation effect units; for example, the organic molecule may contain a benzene ring, or a benzene ring and $CH_2$═CH—CO—, or —CH═CH—CH═$CH_2$ and —CH═CH—CO—, or —CH═CH—CH═CH— and $CH_2$═CH—CO—. The above conjugation effect unit can make organic molecules produce conjugation effect, which modifies the surface of n-type metal oxide nanoparticles, makes the electron transfer between n-type metal oxide nanoparticles easier, and assists the electron transfer between nanoparticles with the help of conjugation effect, thereby improving the electron mobility of n-type metal oxide nanoparticles.

In some embodiments, R in the organic molecule is a hydrocarbyl group or a hydrocarbyl derivative containing a conjugation effect unit of 3-24 carbons; the longer the carbon chain in this range, the more unsaturated bonds the R can contain, so that the more the number of conjugation effect units, the stronger the conjugation effect; further, R in the organic molecule contains 1-9 conjugation effect units, and the more the number of unsaturated bonds in this range, the stronger the conjugation effect.

Further, the organic molecule is polyunsaturated fatty acid or ester of polyunsaturated fatty acid. For example, when the organic molecule is selected from ester of polyunsaturated fatty acid, the organic molecule can be 2-ethylhexyl phthalate, and the organic molecule is selected from polyunsaturated fatty acid, the organic molecule can be at least one selected from the group consisting of phthalic acid, isophthalic acid, 4-bromo-1, 3-benzenedicarboxylic acid.

In some embodiments, the mass ratio of the organic molecule to the n-type metal oxide nanoparticles is (0.1-1): 30. Specifically, the mass ratio of the organic molecule to the n-type metal oxide nanoparticles may be 0.1:30, 0.4:30, 0.6:30, 0.8:30, 1:30 and other ratios. Doping the organic molecule represented by formula I within the above mass ratio range can better improve the electron transportation performance of the composite material.

In some embodiments, the n-type metal oxide nanoparticles are at least one selected from the group consisting of zinc oxide nanoparticles, titanium oxide nanoparticles, tin oxide nanoparticles, zirconium oxide nanoparticles, and aluminum-doped zinc oxide nanoparticles. Specifically, zinc oxides such as ZnO, titanium oxides such as $TiO_2$, tin oxides such as $SnO_2$, zirconium oxides such as $ZrO_2$, aluminum-doped zinc oxides such as AlZnO. Further, the n-type metal oxide nanoparticles are selected from ZnO nanoparticles. ZnO has good electron transportation properties, but the film structure of ZnO nanoparticles after spin coating is often a disordered loose structure, containing a large amount of various defects, such as micropores, etc. Moreover, ZnO has poor contact with the non-polar ligands on the surface of the quantum dots, which makes electron injection difficult. Therefore, combining the organic molecule shown in formula I on the surface of ZnO nanoparticles can enhance the electron conduction ability between nanoparticles, improve the composite material with good film-forming quality and crystalline properties, thereby improving the electron transportation performance of ZnO.

In some embodiments, the composite material consists of the n-type metal oxide nanoparticles and the organic molecule connected to the n-type metal oxide nanoparticles.

On the other hand, the embodiment of the present application also provides a method for preparing the composite material, as shown in FIG. 1, the method includes the following steps:

S01: providing n-type metal oxide nanoparticles and the organic molecule shown in the following formula I;

S02: Dissolving the n-type metal oxide nanoparticles and the organic molecule in a polar solvent to obtain a mixed solution;

S03: Separating solid materials from the mixed solution to obtain the composite material;

Formula I

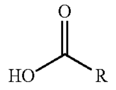

R is a hydrocarbyl group or a hydrocarbyl derivative containing at least one conjugation effect unit.

The method for preparing the composite material provided in the embodiment of the present application comprises dissolving n-type metal oxide nanoparticles and the organic molecule represented by formula I in a polar solvent for dissolution, followed by solid-liquid separation to obtain the composite material. The preparation method is not only simple in process, low in cost, and capable of large-scale preparation, but also the composite material obtained by this preparation method is incorporated with organic molecules of monocarboxylic acid structure of the conjugation effect unit, thereby improving the film formation of the composite material. The quality and crystalline properties enhance the electron mobility of the composite material through conjugation efficiency, so it has a good electron transportation ability.

In some embodiments, the composite material of the embodiments of the present application is prepared by the above-mentioned preparation method. The composite material includes n-type metal oxide nanoparticles and an organic molecule shown in formula I connected to the n-type metal oxide nanoparticles, and the specific preparation steps are as shown above.

In the above-mentioned step S01, in the organic molecule shown in formula I, the conjugation effect unit includes at least one selected from the group consisting of benzene ring, $—CH═CH—CH═CH_2$, —CH═CH—CH═CH—, —CH═CH—CH═O, —CH═CH—CO— and $CH_2═CH—CO—$. R is a hydrocarbyl group or a hydrocarbyl derivative containing a conjugation effect unit of 3-24 carbons; R in the organic molecule contains 1-9 conjugation effect units. Further, the organic molecule can be polyunsaturated fatty acid or ester of polyunsaturated fatty acid, for embodiment, when the organic molecule is selected from ester of polyunsaturated fatty acid, the organic molecule can be 2-ethylhexyl phthalate, and the organic molecule is selected from polyunsaturated fatty acid, the organic molecule can be at least one selected from the group consisting of phthalic acid, isophthalic acid, and 4-bromo-1, 3-benzenedicarboxylic acid; when the organic molecule is selected from ester of polyunsaturated fatty acid, the added raw material can be different ester salts of saturated fatty acids, such as mono(2-ethylhexyl) phthalate sodium salt, mono(2-ethylhexyl) phthalate sodium salt form mono(2-ethylhexyl) phthalate in solution state, which are then bound on the surface of type metal oxide nanoparticles. The n-type metal oxide nanoparticles are at least one selected from the group consisting of zinc oxide nanoparticles, titanium oxide nanoparticles, tin oxide nanoparticles, zirconium oxide nanoparticles and aluminum-doped zinc oxide nanoparticles.

In the above step S02, the mass ratio of the organic molecule to the n-type metal oxide nanoparticles is (0.1-1):30. Specifically, the mass ratio of the organic molecule to the n-type metal oxide nanoparticles may be 0.1:30, 0.4:30, 0.6:30, 0.8:30, 1:30 and other ratios. Doping the organic molecule represented by formula I within this mass ratio range can better improve the electron transportation performance of the composite material. Further, the n-type metal oxide nanoparticles and organic molecules are dissolved in a polar solvent at a temperature of 30-50° C., and the above temperature conditions can better dissolve in the polar solvent to obtain a clear solution. The polar solvent includes at least one selected from the group consisting of ethanol, methanol, water, N,N-dimethylformamide, and N,N-dimethylacetamide.

In the above step S03, the step of separating solid materials from the mixed solution includes annealing and crystallization, for embodiment, separating solid materials from the mixed solution includes annealing and crystallization at a temperature of 80-120° C., for example, the temperature can be 80° C., 100° C., 120° C., etc.; Further, the annealing time is 20 min-40 min, for example, the annealing time can be 20 min, 30 min, 40 min, etc. In a specific embodiment, in order to obtain the composite material thin film, the mixed solution is deposited on the substrate for annealing and crystallization treatment, so as to obtain a composite material film layer, which can be used as an electron transportation film layer.

The composite material film layer obtained after annealing can improve the film-forming crystallinity of the composite material, thereby improving hole transportation. Taking n-type metal oxide nanoparticles as ZnO nanoparticles as an embodiment, ZnO nanoparticles have poor conductivity between particles after spin coating, while in the present application, in the process of polar solvent volatilization to form film crystallization, after the organic molecule with conjugated ligand is coordinated with the metal oxide electron transportation material, due to the large steric hindrance of the structural material in the spatial dimension, which can effectively prevent the local aggregation of metal oxide nanoparticles (the local segregation phenomenon of the superlattice crystal structure, For example, the crystallinity of a certain part of the film is increased, while the crystallinity of other parts of the film is low), thereby improving the uniformity of the metal oxide film and effectively preventing the local concentration of current.

The embodiments of the present application also provide an application of the composite material or the composite material obtained by the preparation method of the composite material as an electron transportation material. Because the above composite material provided in the embodiments of this application is modified by the organic molecule shown in formula I, the electron mobility is higher. By doping the organic molecule into the n-type metal oxide nanoparticles, its electrical performance as an electron transportation layer is improved, so the composite material can be used as an electron transportation material, specifically for the electron transportation layer of quantum dot light-emitting diode.

Finally, an embodiment of the present application provides a quantum dot light-emitting diode, including an anode, a cathode, and a quantum dot light-emitting layer located between the anode and the cathode, and the cathode is connected to the quantum dot light-emitting layer. An electron transportation layer is arranged between the quantum dot light-emitting layer and the cathode and the electron transportation layer consists of the composite material described in the embodiments of the present application.

The electron transportation layer of the quantum dot light-emitting diode provided by the embodiment of the present application is composed of a composite material unique to the embodiment of the present application. The composite material has good film-forming quality and crystalline properties, and can improve the electron mobility. Therefore, the effective utilization rate of electrons is improved, the defect recombination is reduced, the electron injection is enhanced, the charge accumulation at the interface of the quantum dot light-emitting layer and the electron transportation layer is reduced, and the efficiency and lifetime of the QLED device is improved by the device.

In some embodiments, an electron injection layer is further arranged between the electron transportation layer and the cathode. In other embodiments, a hole functional layer, such as a hole transportation layer, or a stacked hole injection layer and a hole transportation layer is disposed between the quantum dot light-emitting layer and the anode, the hole injection layer is adjacent to the anode.

The quantum dot light-emitting diode provided by the embodiments of the present application includes an upright structure and an inverted structure. The upright structure can be substrate/anode/hole injection layer (optional)/hole transportation layer (optional)/quantum dot light-emitting layer/electron transportation layer/electron injection layer (optional))/cathode. The inverted structure is opposite of the upright structure.

Correspondingly, a method for preparing a quantum dot light-emitting diode, includes the following steps:

E01: providing a substrate;

E02: depositing the composite material in the embodiments of this application on the substrate to obtain an electron transportation layer.

In the preparation method of quantum dot light-emitting diode provided in the embodiment of the present application, the unique composite material of the embodiment of the present application is prepared as the electron transportation layer of the device. Because the composite material has good electron transportation performance, the composite material is used as the electron transportation layer. The layer can improve the luminous efficiency and lifetime of the device.

Specifically, the preparation of a QLED device includes the following steps:

(1) Providing a substrate and forming an anode on the substrate;

(2) Forming a hole injection layer on the anode;

(3) Forming a hole transportation layer on the hole injection layer;

(4) Depositing a quantum dot layer on the hole transportation layer;

(5) Depositing an electron transportation layer on the quantum dot layer;

(6) Forming a cathode on the electron transportation layer.

The substrate may be glass, silicon wafer, or the like. The anode can be indium tin oxide (ITO), indium zinc oxide (IZO) or the like. The hole injection layer may be poly(3,4-ethylenedioxythiophene) polystyrene sulfonate (PEDOT:PSS), $MoO_3$, or the like. The hole transportation layer may be poly(9,9-dioctyl-fluorene-co-N-(4-butylphenyl)-diphenylamine) (TFB), polyarylamine, and the like. The material of the quantum dot light-emitting layer may be group II-VI such as CdS, group III-V such as GaN, group IV-VI such as SnS, or a combination thereof. The cathode can be aluminum, silver, etc.

The thickness of the anode is 20-200 nm; the thickness of the hole injection layer is 20-200 nm; the thickness of the hole transportation layer is 30-180 nm; the total thickness of the quantum dot mixed light-emitting layer is 30-180 nm. The thickness of electron transportation layer is 10-180 nm; the thickness of cathode is 40-190 nm.

The application has been subjected to several tests successively, and now a part of the test results are taken as a reference to further describe the application in detail.

Example 1

Figure 2:
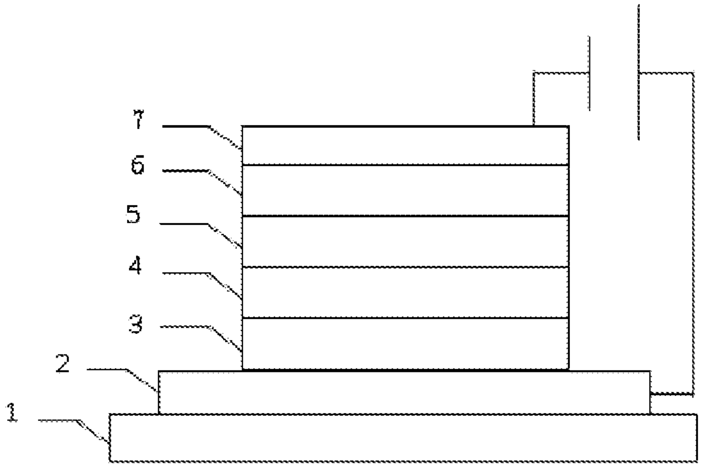
FIG. 2 is a schematic diagram of the structure of a quantum dot light-emitting diode according to an example of the present application.

This example provides a QLED device, the structure of which was shown in FIG. 2, and the structure of the QLED device includes a substrate 1, an anode 2, a hole injection layer 3, a hole transportation layer 4, a quantum dot light-emitting layer 5, an electron transportation layer 6, a cathode 7 sequentially from bottom to top. The material of substrate 1 was glass sheet, the material of anode 2 was ITO substrate (20 nm), the material of hole injection layer 3 was PEDOT:PSS (40 nm), the material of hole transportation layer 4 was TFB (40 nm), the material of dot quantum light-emitting layer 5 was CdZnSe/ZnSe quantum dots (30 nm), the material of electron transportation layer 6 was composite material of ZnO doping modified by mono(2-ethylhexyl) phthalate (30 nm), the material of cathode 7 was Al (40 nm)).

The method for preparing the device includes the following steps:

1. The TFB solution was deposited on the hole injection layer (PEDOT:PSS) by spin coating at a speed of 3000 r/min for 30 s, and then was heated at 150° C. for 30 min to complete the crystallization to obtain the hole transportation layer.
2. The CdZnSe/ZnSe quantum dots were deposited on the hole transportation layer by spin coating at a speed of 3000 r/min for 30 s to obtain a quantum dot light-emitting layer.
3. An electron transportation layer (ETL) was deposited, a certain amount of mono(2-ethylhexyl) phthalate sodium salt was added to the ZnO solution dissolved in ethanol at room temperature. The mass ratio of the doped mono(2-ethylhexyl) phthalate sodium salt to the ZnO material was 1:30, and a clear solution 1 was obtained after heating and dissolving. The clear solution 1 was spin-coated at a speed of 3000 r/min for 30 s and then heated at 80° C. for 30 min to obtain the electron transportation layer.
4. An Al electrode was evaporated and packaged with electronic glue to obtain the QLED device.

Example 2

This example provides a QLED device, which was basically the same as Example 1, except that the material of the electron transportation layer 6 was a composite material of ZnO doping modified by phthalic acid.

The preparation method of the device includes the following steps:

1. The TFB solution was deposited on the hole injection layer (PEDOT:PSS) by spin coating at a speed of 3000 r/min for 30 s, and then was heated at 150° C. for 30 min to complete the crystallization to obtain the hole transportation layer.
2. The CdZnSe/ZnSe/ZnS quantum dots were deposited on the hole transportation layer by spin coating at a speed of 3000 r/min for 30 s to obtain a quantum dot light-emitting layer.
3. An electron transportation layer (ETL) was deposited, a certain amount of phthalic acid was added to the ZnO solution dissolved in ethanol at room temperature. The mass ratio of the phthalic acid to the ZnO material was 0.5:30, and a clear solution 1 was obtained after heating and dissolving. The clear solution 1 was spin-coated at a speed of 3000 r/min for 30 s and then heated at 80° C. for 30 min to obtain the electron transportation layer.
4. An Al electrode was evaporated and packaged with electronic glue to obtain the QLED device.

Example 3

This example provides a QLED device, which was basically the same as Example 1, except that the material of electron transportation layer 6 was a composite material of ZnO doping modified by wasophthalic acid, and the material of cathode 7 was Al.

The preparation method of the device includes the following steps:

1. The TFB solution was deposited on the hole injection layer (PEDOT:PSS) by spin coating at a speed of 3000 r/min for 30 s, and then was heated at 150° C. for 30 min to complete the crystallization to obtain the hole transportation layer.
2. The CdZnSe/ZnSe/ZnS quantum dots were deposited on the hole transportation layer by spin coating at a speed of 3000 r/min for 30 s to obtain a quantum dot light-emitting layer.
3. An electron transportation layer (ETL) was deposited, a certain amount of wasophthalic acid was added to the ZnO solution dissolved in ethanol at room temperature. The mass ratio of the wasophthalic acid to the ZnO material was 1:30, and a clear solution 1 was obtained after heating and dissolving. The clear solution 1 was spin-coated at a speed of 3000 r/min for 30 s and then heated at 80° C. for 30 min to obtain the electron transportation layer.
4. An Al electrode was evaporated and packaged with electronic glue to obtain the QLED device.

Example 4

This example provides a QLED device, which was basically the same as Example 1, except that the material of electron transportation layer 6 was a composite material of ZnO doping modified by 4-bromo-1, 3-benzenedicarboxylic acid, and the material of cathode 7 was Al.

The preparation method of the device includes the following steps:

1. The TFB solution was deposited on the hole injection layer (PEDOT:PSS) by spin coating at a speed of 3000 r/min for 30 s, and then was heated at 150° C. for 30 min to complete the crystallization to obtain the hole transportation layer.
2. The CdZnSe/ZnSe quantum dots were deposited on the hole transportation layer by spin coating at a speed of 3000 r/min for 30 s to obtain a quantum dot light-emitting layer.

3. An electron transportation layer (ETL) was deposited, a certain amount of 4-bromo-1, 3-benzenedicarboxylic acid was added to the ZnO solution dissolved in ethanol at room temperature. The mass ratio of the 4-bromo-1, 3-benzenedicarboxylic acid to the ZnO material was 1:30, and a clear solution 1 was obtained after heating and dissolving. The clear solution 1 was spin-coated at a speed of 3000 r/min for 30 s and then heated at 80° C. for 30 min to obtain the electron transportation layer.
4. An Al electrode was evaporated and packaged with electronic glue to obtain the QLED device.

Example 5

This example provides a QLED device, which was basically the same as Example 1, except that the material of electron transportation layer 6 was a composite material of $TiO_2$ doping modified by 2-ethylhexyl phthalate, and the material of cathode 7 was Al.

The preparation method of the device includes the following steps:

1. The TFB solution was deposited on the hole injection layer (PEDOT:PSS) by spin coating at a speed of 3000 r/min for 30 s, and then was heated at 150° C. for 30 min to complete the crystallization to obtain the hole transportation layer.
2. The CdZnSe/ZnSe quantum dots were deposited on the hole transportation layer by spin coating at a speed of 3000 r/min for 30 s to obtain a quantum dot light-emitting layer.
3. An electron transportation layer (ETL) was deposited, a certain amount of mono(2-ethylhexyl) phthalate sodium salt was added to the $TiO_2$ solution dissolved in ethanol at room temperature. The mass ratio of the doped mono(2-ethylhexyl) phthalate sodium salt to the $TiO_2$ material was 1:30, and a clear solution 1 was obtained after heating and dissolving. The clear solution 1 was spin-coated at a speed of 3000 r/min for 30 s and then heated at 80° C. for 30 min to obtain the electron transportation layer.
4. An Al electrode was evaporated and packaged with electronic glue to obtain the QLED device.

Example 6

This example provides a QLED device, which was basically the same as Example 1, except that the material of electron transportation layer 6 was a composite material of $SnO_2$ doping modified by 2-ethylhexyl phthalate, and the material of cathode 7 was Al.

The preparation method of the device includes the following steps:

1. The TFB solution was deposited on the hole injection layer (PEDOT:PSS) by spin coating at a speed of 3000 r/min for 30 s, and then was heated at 150° C. for 30 min to complete the crystallization to obtain the hole transportation layer.
2. The CdZnSe/ZnSe quantum dots were deposited on the hole transportation layer by spin coating at a speed of 3000 r/min for 30 s to obtain a quantum dot light-emitting layer.
3. An electron transportation layer (ETL) was deposited, a certain amount of mono(2-ethylhexyl) phthalate sodium salt was added to the $SnO_2$ solution dissolved in ethanol at room temperature. The mass ratio of the doped mono(2-ethylhexyl) phthalate sodium salt to the $SnO_2$ material was 1:30, and a clear solution 1 was obtained after heating and dissolving. The clear solution 1 was spin-coated at a speed of 3000 r/min for 30 s and then heated at 80° C. for 30 min to obtain the electron transportation layer.
4. An Al electrode was evaporated and packaged with electronic glue to obtain the QLED device.

Comparative Example 1

In this comparative example, other preparation methods were the same as those in Example 1, except that the material of the electron transportation layer was an undoped ZnO material.

Comparative Example 2

Except that the material of the electron transportation layer was an undoped ZnO material, other preparation methods of this comparative example were the same as those of Example 2.

Comparative Example 3

Except that the material of the electron transportation layer was an undoped ZnO material, other preparation methods in this comparative example were the same as those in Example 3.

Comparative Example 4

Except that the material of the electron transportation layer was an undoped ZnO material, other preparation methods of this comparative example were the same as those of Example 4.

Comparative Example 5

In this comparative example, other preparation methods were the same as those in Example 5, except that the material of the electron transportation layer was an undoped $TiO_2$ material.

Comparative Example 6

Except that the material of the electron transportation layer was an undoped $SnO_2$ material, other preparation methods of this comparative example were the same as those of Example 6.

Performance Test

The quantum dot light-emitting diodes prepared in the above Comparative Examples 1-6 and Examples 1-6 were tested for performance, and the test method was as follows:

(1) External Quantum Dot Efficiency:

The ratio of the number of electron-hole pairs injected into the quantum dots converted into the number of photons emitted, the unit was %, was an important parameter to measure the quality of electroluminescent devices, and can be obtained by EQE optical testing instrument. The specific calculation formula was as follows:

$$EQE = \eta_e \eta_r \chi \frac{K_R}{K_R + K_{NR}}$$

where $\eta_e$ was the optical output coupling efficiency, $\eta_r$ was the ratio of the number of recombined carriers to the number of injected carriers, $\chi$ was the ratio of the number of photons generated to the total number of excitons, $K_R$ was the radiation process rate, and $K_{NR}$ was nonradiative process rate.

Test conditions: At room temperature, the air humidity was 30-60%.

(2) QLED Device Lifetime:

The time required for the brightness of the device to decrease to a certain proportion of the maximum brightness under constant current or voltage driving, and the time when the brightness drops to 95% of the maximum brightness was defined as T95, and this lifetime was the measured lifetime. In order to shorten the test period, the device lifetime test was usually carried out by accelerating the aging of the device under high brightness with reference to the OLED device test, and the lifetime under high brightness was obtained by fitting the extended exponential decay brightness decay fitting formula, such as: 1000 nit. Lifetime meter was $T95_{1000,nit}$. The specific calculation formula was as following:

$$T95_L = T95_H \cdot \left(\frac{L_H}{L_L}\right)^A$$

In the formula, T95L was the lifetime at low brightness, T95H was the measured lifetime at high brightness, LH was the acceleration of the device to the highest brightness, LL was 1000 nit, and A was the acceleration factor. For QLED, the value was usually 1.6-2, In this experiment, the A value was 1.7 by measuring the lifetime of several groups of green QLED devices under rated brightness.

The lifetime test system was used to carry out the life test of the corresponding devices. The test conditions were: at room temperature, and the air humidity was 30~60%.

(3) Electron mobility: the average velocity obtained by the carrier under the action of the unit electric field, which reflects the transportation ability of the carrier under the action of the electric field, and the unit was $cm^2/(V \cdot s)$. It can be obtained by preparing the corresponding pure electronic devices and then using the space charge limited amperometric method (SCLC). The structure of the pure electronic device was as follows: anode/electron transportation layer to be determined/cathode. The specific calculation formula was as follows:

$$J=(9/8)/\varepsilon_r \varepsilon_o \mu_e V^2/d^3$$

In the formula, J was the current density, in mA $cm^{-2}$; $\varepsilon_r$ was the relative permittivity, $\varepsilon_o$ was the vacuum permittivity, $\mu_e$ electron mobility, in $cm^2/(V \cdot s)$; V was the driving voltage, the unit was V; d was the film thickness, and the unit was m.

Test conditions: At room temperature, the air humidity was 30~60%.

The above test results are shown in Table 1:

| | Comparative Example 1 | Example 1 | Comparative Example 2 | Example 2 | Comparative Example 3 | Example 3 |
|---|---|---|---|---|---|---|
| EQEmax (%) | 8.2 | 9.6 | 7.6 | 9.7 | 2.7 | 5.1 |
| Electron mobility ($cm^2/(V \cdot s)$) | $2.0 \times 10^{-3}$ | $2.1 \times 10^{-3}$ | $2.0 \times 10^{-3}$ | $2.1 \times 10^{-3}$ | $2.0 \times 10^{-3}$ | $2.6 \times 10^{-3}$ |
| $T95_{1000\,nit}$(h) | 72.91 | 100.44 | 82.76 | 114.31 | 51.39 | 78.95 |

-continued

| | Comparative Example 4 | Example 4 | Comparative Example 5 | Example 5 | Comparative Example 6 | Example 6 |
|---|---|---|---|---|---|---|
| EQEmax (%) | 3.4 | 4.7 | 2.1 | 4.1 | 3.5 | 5.1 |
| Electron mobility ($cm^2/(V \cdot s)$) | $2.0 \times 10^{-3}$ | $2.3 \times 10^{-3}$ | $1.0 \times 10^{-4}$ | $1.8 \times 10^{-4}$ | $9.32 \times 10^{-4}$ | $1.52 \times 10^{-3}$ |
| $T95_{1000\ nit}$(h) | 44.65 | 70.61 | 15.51 | 28.89 | 8.93 | 13.87 |

As can be seen from Table 1 above, in the quantum dot light-emitting diodes of the examples of the present application, the electron mobility of the electron transportation layer film is significantly higher than that of the electron transportation layer films in the corresponding comparative examples. And the external quantum efficiency and lifetime of the quantum dot light-emitting diodes provided by the examples of the present application are significantly higher than those of the quantum dot light-emitting diodes in the corresponding comparative examples, indicating that the quantum dot light-emitting diodes of the examples of the present application have better luminous efficiency.

The above are only optional examples of the present application, and are not intended to limit the present application. Various modifications and variations of this application are possible for those skilled in the art. Any modification, equivalent replacement, improvement made within the spirit and principle of this application shall be within the scope of the claims of this application.

What is claimed is:

1. An electron transportation film layer comprising a composite material, the composite material comprising:

n-type metal oxide nanoparticles; and an organic molecule as shown in Formula I connected to the n-type metal oxide nanoparticles;

Formula I

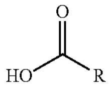

wherein:

the organic molecule is bound on the surface of the n-type metal oxide nanoparticles by carboxyl groups;

R is a hydrocarbyl group or a hydrocarbyl derivative containing a benzene ring;

the organic molecule is selected from phthalic acid and 4-bromo-1, 3-benzenedicarboxylic acid, or mono(2-ethylhexyl) phthalate.

2. The electron transportation film layer according to claim 1, wherein a mass ratio of the organic molecule to the n-type metal oxide nanoparticles is (0.1-1): 30.

3. The electron transportation film layer according to claim 1, wherein the organic molecule is mono(2-ethylhexyl) phthalate.

4. The electron transportation film layer according to claim 1, wherein the n-type metal oxide nanoparticles are at least one selected from the group consisting of zinc oxide nanoparticles, titanium oxide nanoparticles, tin oxide nanoparticles, zirconium oxide nanoparticles and aluminum-doped zinc oxide nanoparticles.

5. The electron transportation film layer according to claim 1, consisting of the n-type metal oxide nanoparticles and the organic molecule connected to the n-type metal oxide nanoparticles.

6. A method for preparing a composite material, comprising:

providing n-type metal oxide nanoparticles and an organic molecule shown in Formula I below;

dissolving the n-type metal oxide nanoparticles and the organic molecule in a polar solvent to obtain a mixed solution; and separating solid materials from the mixed solution to obtain the composite material;

Formula I

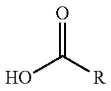

wherein:

R is a hydrocarbyl group or a hydrocarbyl derivative containing a benzene ring;

the organic molecule is a polyunsaturated fatty acid or an ester of polyunsaturated fatty acid;

the polyunsaturated fatty acid is at least one selected from the group consisting of phthalic acid and 4-bromo-1, 3-benzenedicarboxylic acid; and the step of separating solid materials from the mixed solution comprises annealing and crystallization at a temperature of 80-120° C.

7. The method for preparing the composite material according to claim 6, wherein a mass ratio of the organic molecule to the n-type metal oxide nanoparticles is (0.1-1): 30.

8. The method for preparing the composite material according to claim 6, wherein the ester of polyunsaturated fatty acid is selected from mono(2-ethylhexyl) phthalate.

9. The method for preparing the composite material according to claim 6, wherein the n-type metal oxide nanoparticles are at least one selected from the group consisting of zinc oxide nanoparticles, titanium oxide nanoparticles, tin oxide nanoparticles, zirconium oxide nanoparticles and aluminum-doped zinc oxide nanoparticles.

10. A quantum dot light-emitting diode, comprising:

an anode;

a cathode; and a quantum dot light-emitting layer between the anode and the cathode;

wherein an electron transportation layer is arranged between the cathode and the quantum dot light-emitting layer, and the electron transportation layer comprises a composite material comprising:

n-type metal oxide nanoparticles; and an organic molecule as shown in the following Formula I connected to the n-type metal oxide nanoparticles;

Formula I

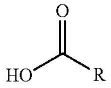

wherein:

the organic molecule is bound on the surface of the n-type metal oxide nanoparticles by carboxyl groups;

R is a hydrocarbyl group or a hydrocarbyl derivative containing a benzene ring; and the organic molecule is selected from phthalic acid and 4-bromo-1, 3-benzenedicarboxylic acid, or mono(2-ethylhexyl) phthalate.

11. The quantum dot light-emitting diode according to claim 10, wherein the mass ratio of the organic molecule to the n-type metal oxide nanoparticles is (0.1-1): 30.

12. The quantum dot light-emitting diode according to claim 10, wherein the organic molecule is mono(2-ethylhexyl) phthalate.

13. The quantum dot light-emitting diode of claim 10, wherein the n-type metal oxide nanoparticles are at least one selected from the group consisting of zinc oxide nanoparticles, titanium oxide nanoparticles, tin oxide nanoparticles, zirconium oxide nanoparticles and aluminum-doped zinc oxide nanoparticles.

* * * * *